United States Patent
Lin et al.

(10) Patent No.: US 10,999,952 B1
(45) Date of Patent: May 4, 2021

(54) VAPOR CHAMBER AND MANUFACTURING METHOD THEREOF

(71) Applicant: TAIWAN MICROLOOPS CORP., New Taipei (TW)

(72) Inventors: Chun-Hung Lin, New Taipei (TW); Chien-Cheng Hsu, New Taipei (TW)

(73) Assignee: TAIWAN MICROLOOPS CORP., New Taipei (TW)

(*) Notice: Subject to any disclaimer, the term of this patent is extended or adjusted under 35 U.S.C. 154(b) by 0 days.

(21) Appl. No.: 16/732,614

(22) Filed: Jan. 2, 2020

(51) Int. Cl.
*H05K 7/20* (2006.01)
*F28D 15/02* (2006.01)
*F28D 15/04* (2006.01)
*F28D 15/06* (2006.01)

(52) U.S. Cl.
CPC ......... *H05K 7/20381* (2013.01); *F28D 15/02* (2013.01); *F28D 15/0233* (2013.01); *F28D 15/0283* (2013.01); *F28D 15/04* (2013.01); *F28D 15/06* (2013.01); *H05K 7/20309* (2013.01); *H05K 7/20336* (2013.01); *B23P 2700/09* (2013.01)

(58) Field of Classification Search
CPC .... F28F 3/12; F28F 2200/005; F28F 2220/00; F28F 2230/00; F28D 15/02; F28D 15/0233; F28D 15/0283; F28D 15/04; F28D 15/06; B23P 2700/09
See application file for complete search history.

(56) References Cited

U.S. PATENT DOCUMENTS

| 3,776,304 | A | * | 12/1973 | Auerbach | F28D 15/06 165/96 |
| 3,797,086 | A | * | 3/1974 | Asselman | F28D 15/0283 29/890.032 |
| 5,076,351 | A | * | 12/1991 | Munekawa | F28D 15/0283 165/104.21 |
| 5,427,174 | A | * | 6/1995 | Lomolino, Sr. | F28D 15/0233 165/104.13 |
| 6,082,443 | A | * | 7/2000 | Yamamoto | F28D 15/0233 165/104.21 |
| 6,216,343 | B1 | * | 4/2001 | Leland | B21C 37/225 29/890.03 |
| 6,230,407 | B1 | * | 5/2001 | Akutsu | F28D 15/0233 29/890.032 |
| 6,269,866 | B1 | * | 8/2001 | Yamamoto | F28D 15/0233 165/104.26 |
| 9,423,192 | B2 | * | 8/2016 | Tsoi | F28F 3/048 |

(Continued)

*Primary Examiner* — Jianying C Atkisson
*Assistant Examiner* — Jose O Class-Quinones
(74) *Attorney, Agent, or Firm* — Chung-Ming Shih; HDLS IPR Services

(57) ABSTRACT

A vapor chamber and a manufacturing method thereof are provided. The vapor chamber includes a housing, a capillary structure, at least two liquid-filling and gas-discharging pipes and a working fluid; the housing has a bottom housing plate and a top housing plate correspondingly engaged and sealed with the bottom housing plate, and a single chamber is formed between the top housing plate and the bottom housing plate; the capillary structure is disposed in the single chamber; each of the liquid-filling and gas-discharging pipes is allowed to penetrate into the housing and communicate with the single chamber; and the working fluid is disposed in the single chamber. Accordingly, the working fluid can be evenly and widely distributed in the single chamber.

3 Claims, 6 Drawing Sheets

(56) References Cited

U.S. PATENT DOCUMENTS

| | | | | |
|---|---|---|---|---|
| 9,841,246 | B2* | 12/2017 | Lin | F28D 15/0233 |
| 2002/0134534 | A1* | 9/2002 | Estes | F28F 3/027 |
| | | | | 165/104.33 |
| 2003/0173064 | A1* | 9/2003 | Ueki | F28D 15/0233 |
| | | | | 165/104.21 |
| 2004/0194311 | A1* | 10/2004 | Hsu | F28D 15/0258 |
| | | | | 29/890.032 |
| 2005/0022414 | A1* | 2/2005 | Hsu | F28D 15/0283 |
| | | | | 34/92 |
| 2005/0045278 | A1* | 3/2005 | Lin | B01D 5/0015 |
| | | | | 165/104.26 |
| 2005/0178532 | A1* | 8/2005 | Meng-Cheng | F28D 15/0233 |
| | | | | 165/104.33 |
| 2005/0225943 | A1* | 10/2005 | Shih | H01L 23/427 |
| | | | | 361/700 |
| 2006/0098411 | A1* | 5/2006 | Lee | F28D 15/046 |
| | | | | 361/704 |
| 2006/0117557 | A1* | 6/2006 | Li | F28D 15/0283 |
| | | | | 29/726 |
| 2006/0144230 | A1* | 7/2006 | Li | B01D 5/0093 |
| | | | | 95/241 |
| 2006/0150647 | A1* | 7/2006 | Li | F25B 43/04 |
| | | | | 62/197 |
| 2006/0162160 | A1* | 7/2006 | Hsu | F28D 15/0258 |
| | | | | 29/890.032 |
| 2006/0213647 | A1* | 9/2006 | Lin | H01L 21/4882 |
| | | | | 165/104.26 |
| 2006/0283578 | A1* | 12/2006 | Hsu | E05F 15/40 |
| | | | | 165/104.26 |
| 2008/0080133 | A1* | 4/2008 | Yang | H05K 7/20336 |
| | | | | 361/688 |
| 2008/0087405 | A1* | 4/2008 | Meng | F28D 15/0283 |
| | | | | 165/104.26 |
| 2009/0025910 | A1* | 1/2009 | Hoffman | H01L 23/427 |
| | | | | 165/104.26 |
| 2009/0178784 | A1* | 7/2009 | Wang | F28D 15/0233 |
| | | | | 165/104.26 |
| 2009/0242169 | A1* | 10/2009 | Meyer, IV | F28D 15/0233 |
| | | | | 165/80.3 |
| 2010/0132922 | A1* | 6/2010 | Meyer, IV | F28F 1/06 |
| | | | | 165/104.19 |
| 2010/0243212 | A1* | 9/2010 | Meyer, IV | F28D 15/04 |
| | | | | 165/104.26 |
| 2011/0186268 | A1* | 8/2011 | Yang | F28D 15/02 |
| | | | | 165/104.26 |
| 2014/0131013 | A1* | 5/2014 | Horng | F28D 15/046 |
| | | | | 165/104.26 |
| 2016/0088769 | A1* | 3/2016 | Hsiao | F28D 15/0275 |
| | | | | 361/700 |
| 2016/0128234 | A1* | 5/2016 | Uesugi | H01L 23/427 |
| | | | | 361/700 |
| 2017/0059254 | A1* | 3/2017 | Zhang | F28D 15/0233 |
| 2018/0017335 | A1* | 1/2018 | Lin | F28D 15/0275 |
| 2019/0335619 | A1* | 10/2019 | Tseng | H01L 23/427 |
| 2019/0339020 | A1* | 11/2019 | Tseng | F28D 15/046 |

* cited by examiner

VAPOR CHAMBER AND MANUFACTURING METHOD THEREOF

SUMMARY OF THE INVENTION

Field of the Invention

The present invention relates to a heat dissipation technology, specifically to a vapor chamber and a manufacturing method thereof.

Description of Related Art

With the currently increasing calculation speeds of electronic components, the heat generated by electronic components are also increasing as a result. To effectively solve the problems caused by high heat, people skilled in the art have already been using a vapor chamber with excellent thermal conductivity to dissipate the heat. However, the conventional vapor chamber still has many disadvantages, including poor thermal conducting performance, high production costs and manufacturing difficulty, which all need to be improved.

The conventional vapor chamber mainly includes a top housing member and a bottom housing member, and a capillary tissue disposed in an internal space defined at the inner sides of the top housing member and the bottom housing member. The top housing member and the bottom housing member are correspondingly engaged with a soldering means, and a working fluid is filled inside the top housing member and the bottom housing member. Lastly, a gas discharging and sealing operation is processed to finish the assembly.

Because the means of generating heat sources of electronic components vary with further developments in technology, the shape of the vapor chamber applied in the above-mentioned heat source has to be correspondingly changed, and the amount of working fluid affects the quantity of limited space for the phase changes of vaporizing and liquidizing. In other words, an excessive amount of the working fluid would greatly reduce the vaporizing space, and an inadequate amount of the working fluid would cause an internal idle burning situation. As such, for a conventional vapor chamber with a larger contact surface area or a certain shape, the filled working fluid cannot be evenly and widely distributed in an internal space of each housing causing poor thermal conductivity and poor heat dissipation.

Accordingly, the applicant of the present invention has devoted himself to improving the mentioned disadvantages.

SUMMARY OF THE INVENTION

The present invention is to provide a vapor chamber and a manufacturing method thereof, which has an advantage of allowing a working fluid to be evenly and widely distributed in single chamber with an installation of each liquid-filling and gas-discharging pipe.

Accordingly, the present invention provides a vapor chamber, which includes a housing, a capillary structure, at least two liquid-filling and gas-discharging pipes and a working fluid; the housing has a bottom housing plate and a top housing plate correspondingly engaged and sealed with the bottom housing plate, and a single chamber is formed between the top housing plate and the bottom housing plate; the capillary structure is disposed in the single chamber; each of the liquid-filling and gas-discharging pipes is allowed to penetrate into the housing and communicate with the single chamber; and the working fluid is disposed in the single chamber.

Accordingly, the present invention provides a manufacturing method of a vapor chamber, which includes steps of: a) providing a housing having a single chamber and at least two liquid-filling and gas-discharging pipes; b) providing a working fluid to be filled into the single chamber via each of the liquid-filling and gas-discharging pipes; c) processing a heating operation to the housing for allowing gas inside the single chamber to be discharged via each of the liquid-filling and gas-discharging pipes; and d) processing an edge sealing operation to each of the liquid-filling and gas-discharging pipes after the step c).

In comparison with related art, the present invention has advantageous features as follows. Because the working fluid is evenly distributed, the thermal conducting and the heat dissipating performance of the vapor chamber can be increased. With each of the liquid-filling and gas-discharging pipes being evenly arranged, the working fluid can be more easily filled, thereby allowing the manufacturing process to be simplified.

DETAILED DESCRIPTION OF THE INVENTION

Preferred embodiments of the present invention will be described with reference to the drawings.

Figure 1:
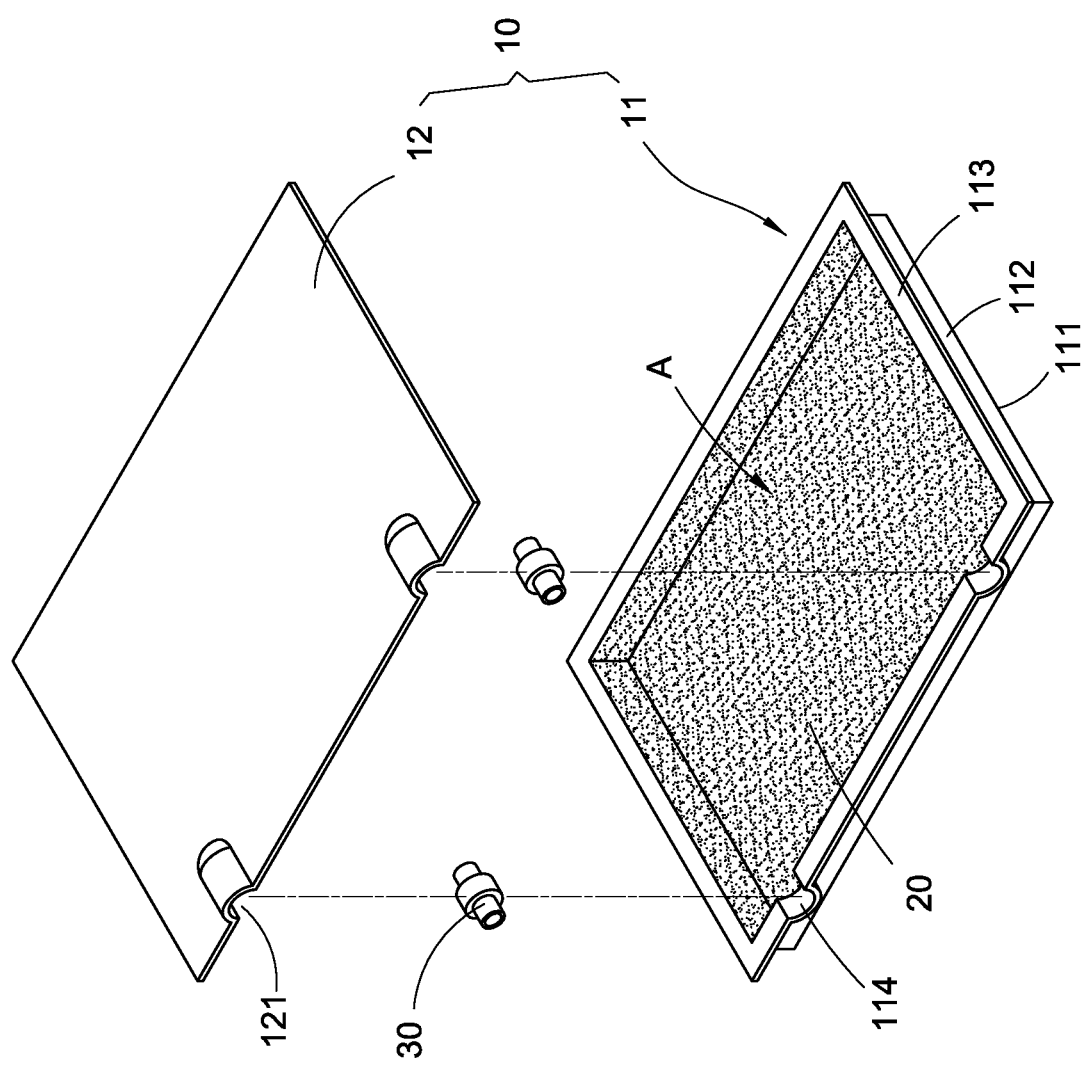
FIG. 1 is a perspective view showing a vapor chamber according to a first embodiment of the present invention.
Figure 2:
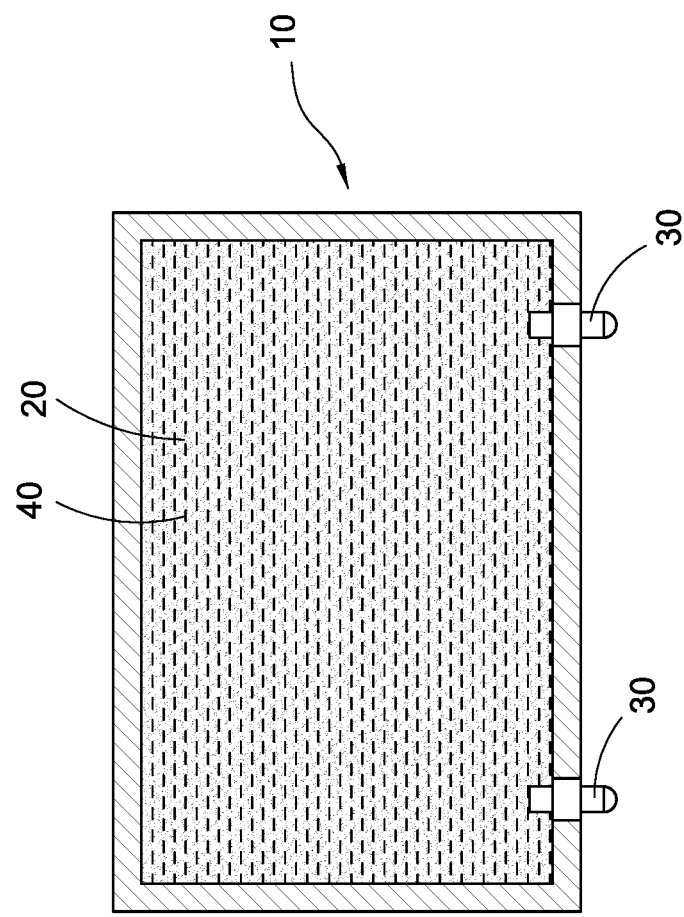
FIG. 2 is a top view showing the assembly of the vapor chamber according to the first embodiment of the present invention.

Please refer from FIG. 1 and FIG. 2, a vapor chamber including a housing 10, a capillary structure 20, at least two liquid-filling and gas-discharging pipes 30 and a working fluid 40 is disclosed according to a first embodiment of the present invention.

According to this embodiment, the housing 10 is substantially formed in a rectangular shape, and mainly has a bottom housing plate 11 and a top housing plate 12, the bottom housing plate 11 can be made of a material with a good thermal conductivity, for example copper, aluminum or an alloy thereof; according to this embodiment, the bottom housing plate 11 mainly has a bottom plate 111, a surround plate 112 and a folded edge plate 113. The surround plate 112 is formed by being bent from a periphery of the bottom plate 111. The folded edge plate 113 is formed by being outwardly bent from edges of the surround plate 112, and two recesses 114 spaced with an interval are formed on the folded edge plate 113.

The top housing plate 12 can be made of a material with good thermal conductivity, for example copper, aluminum or an alloy thereof. The top housing plate 12 is correspondingly engaged with the bottom housing plate 11 with soldering as a means for it to be sealed, a single chamber A is defined inside the top housing plate 12 and the bottom housing plate 11, and a concave slot 121 is respectively formed on the top housing plate 12 corresponding to each of the recesses 114 with a punching means.

The capillary structure 20 is disposed on inner surfaces of the bottom housing plate 11 and the top housing plate 12 and formed inside the single chamber A. The capillary structure 20 can be an object having a capillary absorbing capability, for example a woven net, sintered metal powers or fiber bundles.

Each of the liquid-filling and gas-discharging pipes 30 is disposed at a lateral side of the housing 10 corresponding to the recesses 114 and the concave slots 121, and is communicated with the single chamber A; according to this embodiment, the liquid-filling and gas-discharging pipes 30 are arranged on a same side of the housing 10 and spaced with an equal interval.

The working fluid 40 can be pure water, and filled into the single chamber A via each of the liquid-filling and gas-discharging pipes 30.

Figure 3:
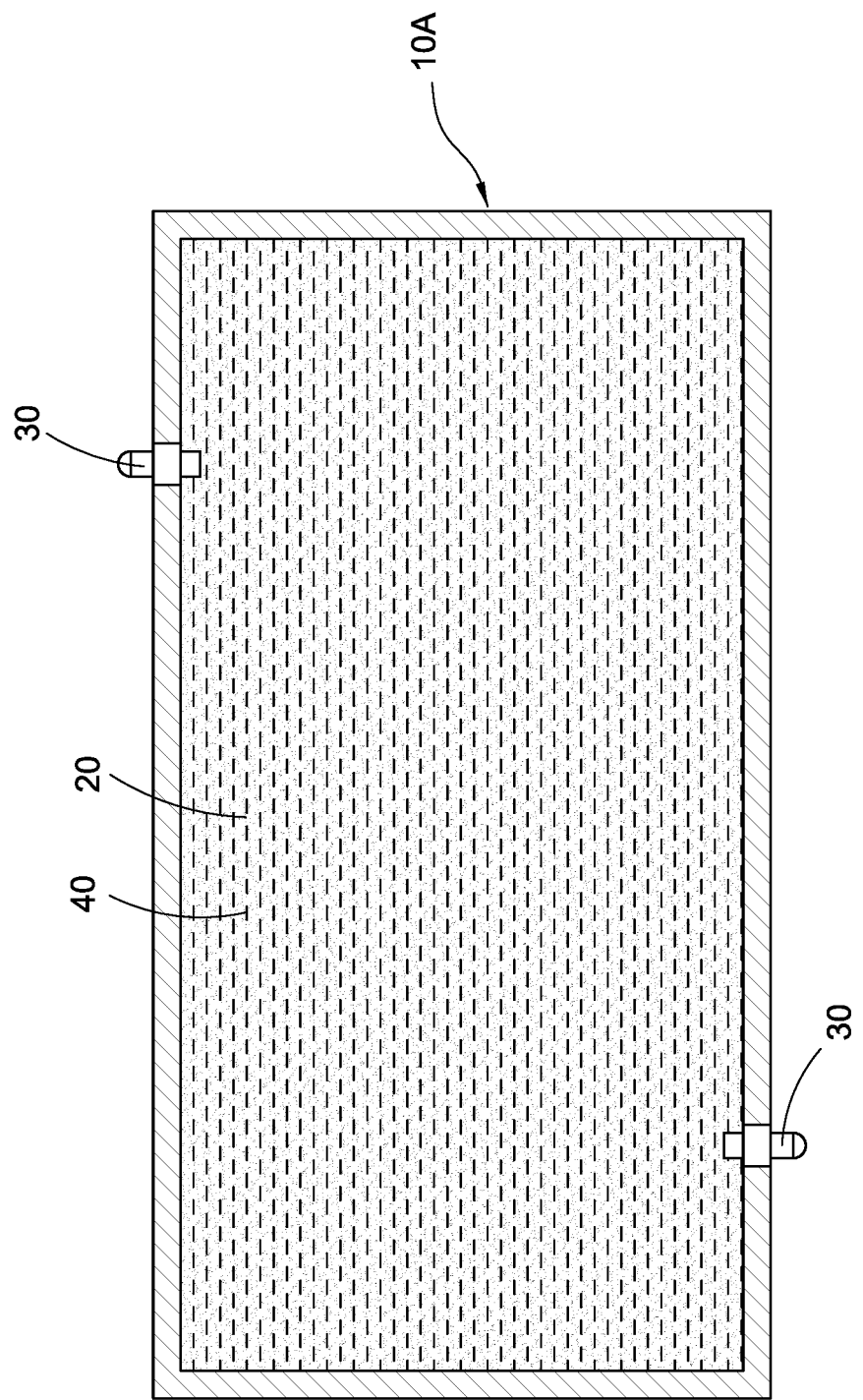
FIG. 3 is a top view showing the assembly of the vapor chamber according to a second embodiment of the present invention.

Please refer to FIG. 3, which discloses a second embodiment of the present invention. According to this embodiment, a housing 10A is substantially formed in a rectangular shape, and a difference between the first embodiment and the second embodiment is that the liquid-filling and gas-discharging pipes 30 are disposed at two opposite sides of the housing 10A and staggeringly arranged.

Figure 4:
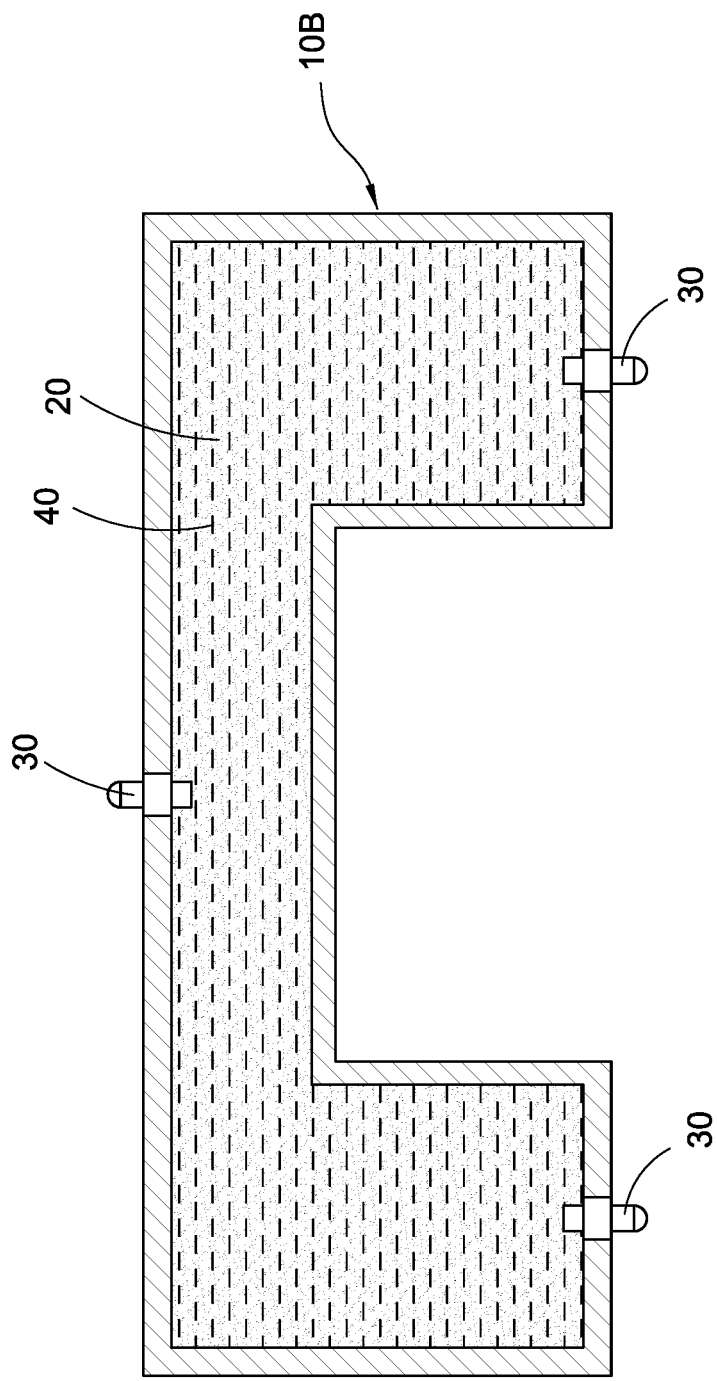
FIG. 4 is a top view showing the assembly of the vapor chamber according to a third embodiment of the present invention.

Please refer to FIG. 4, which discloses a third embodiment of the present invention. According to this embodiment, a housing 10B is formed in a U-like shape, and there are three liquid-filling and gas-discharging pipes 30, wherein two of the liquid-filling and gas-discharging pipes 30 are disposed at a central location of an opened side of the housing 10B, and the other liquid-filling and gas-discharging pipe 30 is disposed at a central location of a sealed side of the housing 10B.

Figure 5:
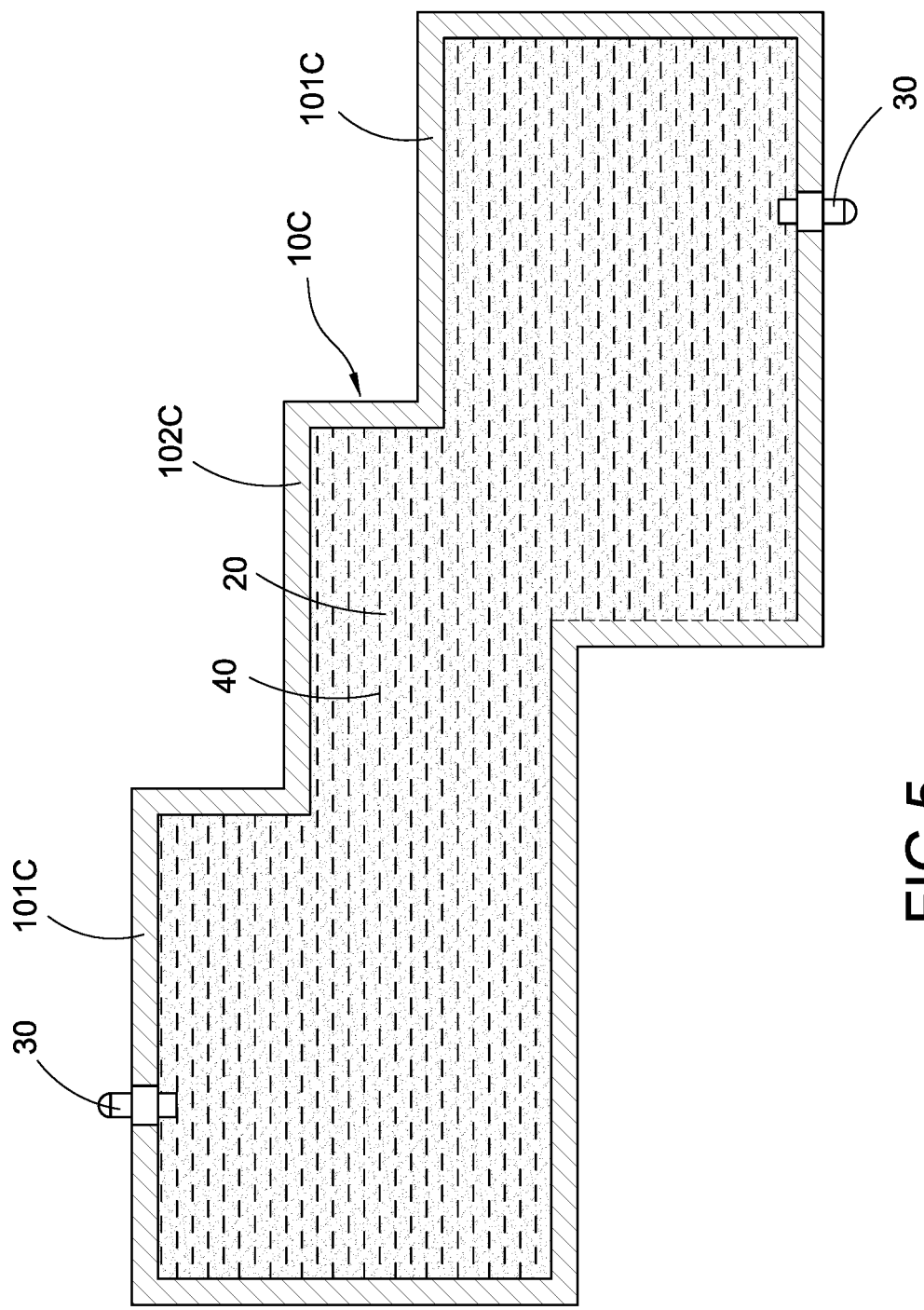
FIG. 5 is a top view showing the assembly of the vapor chamber according to a fourth embodiment of the present invention.

Please refer to FIG. 5, which discloses a fourth embodiment of the present invention. According to this embodiment, a housing 10C mainly has a first rectangular member 101C, a second rectangular member 102C and a third rectangular member 103C, wherein the third rectangular member 103C, the second rectangular member 102C and the first rectangular member 101C are arranged in a staggering means thereby forming a stepped status, wherein one of the liquid-filling and gas-discharging pipes 30 is disposed at a lateral side of the first rectangular member 101C, and the other liquid-filling and gas-discharging pipe 30 is disposed at a lateral side of the third rectangular member 103C.

Figure 6:
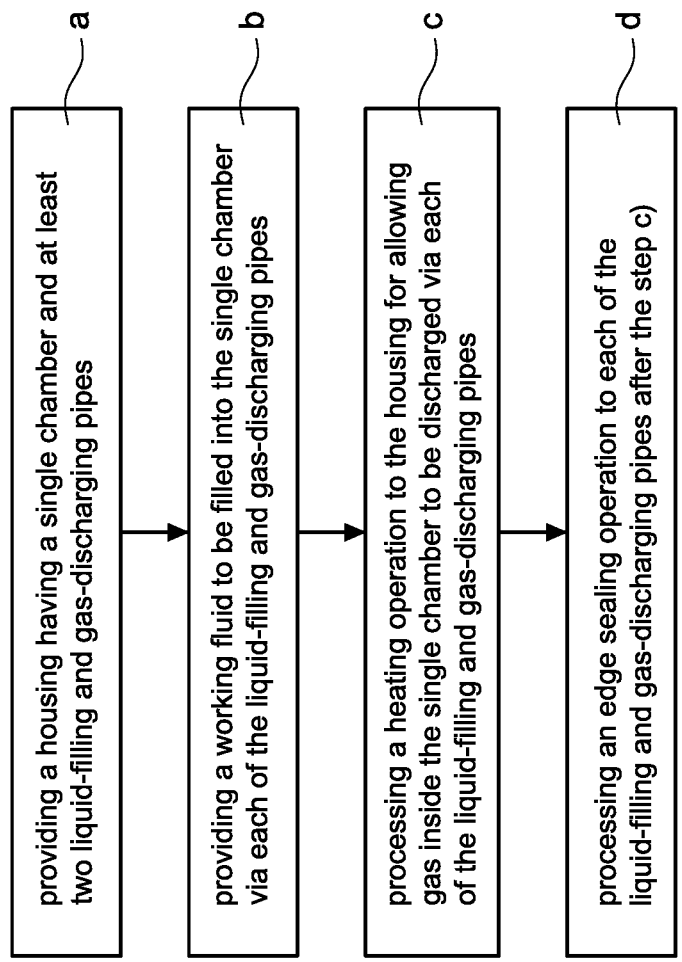
FIG. 6 is a flowchart showing a manufacturing method of a vapor chamber according to the present invention.

Please refer to FIG. 6, which discloses a manufacturing method of a vapor chamber, which includes the steps of:

a) providing a housing 10 having a single chamber A and at least two liquid-filling and gas-discharging pipes 30;

b) providing a working fluid 40 to be filled into the single chamber A via each of the liquid-filling and gas-discharging pipes 30; details are provided as follows: one of the liquid-filling and gas-discharging pipes 30 serves as a means of filling in the working fluid 40, and the other liquid-filling and gas-discharging pipe 30 serves as a means of discharging gas, so that gas inside the single chamber A can be easily discharged; or both of the liquid-filling and gas-discharging pipes 30 can serve to fill in the working fluid 40.

c) processing a heating operation to the housing 10 for allowing gas inside the single chamber A to be discharged via each of the liquid-filling and gas-discharging pipes 30; details are provided as follows: one of the liquid-filling and gas-discharging pipes 30 is served to block, and the other liquid-filling and gas-discharging pipe 30 is served to discharge gas, a portion of the housing 10 close to the blocked liquid-filling and gas-discharging pipe 30 is heated for discharging gas in the blocked liquid-filling and gas-discharging pipe 30; or both of the liquid-filling and gas-discharging pipes 30 can be served to discharge gas.

d) processing a sealing operation to each of the liquid-filling and gas-discharging pipes 30 after the step c); details are provided as follows: after the gas discharging processing, an edge sealing operation can be processed to each of the liquid-filling and gas-discharging pipes 30 through the means of soldering.

Based on what has been disclosed above, the vapor chamber and the manufacturing method thereof provided by the present invention are novel and more practical in use compared to prior art.

Although the present invention has been described with reference to the foregoing preferred embodiment, it will be understood that the invention is not limited to the details thereof. Various equivalent variations and modifications can still be developed by those skilled in the art in view of the teachings of the present invention. Thus, all such variations and equivalent modifications are also embraced within the scope of the invention as defined in the appended claims.

What is claimed is:

1. A manufacturing method of a vapor chamber, including steps of:
    a) providing a housing having a single chamber and at least two liquid-filling and gas-discharging pipes;
    b) providing a working fluid to be filled into the single chamber via at least one of the liquid-filling and gas-discharging pipes;
    c) processing a heating operation to the housing for allowing gas inside the single chamber to be discharged via at least one of the liquid-filling and gas-discharging pipes; and
    d) processing an edge sealing operation to each of the liquid-filling and gas-discharging pipes after the step c),
    wherein the step c) is to utilize one of the liquid-filling and gas-discharging pipes to block gas, and the other liquid-filling and gas-discharging pipe to discharge gas.

2. The method according to claim 1, wherein the step b) is to utilize one of the liquid-filling and gas-discharging pipes to fill fluid, and the other liquid-filling and gas-discharging pipe to discharge gas.

3. The method according to claim 1, wherein the step b) is to utilize both of the liquid-filling and gas-discharging pipes to fill fluid.

* * * * *